United States Patent [19]
Zehavi

[11] Patent Number: 5,428,631
[45] Date of Patent: Jun. 27, 1995

[54] METHOD AND APPARATUS FOR RESOLVING PHASE AMBIGUITIES IN TRELLIS CODED MODULATED DATA

[75] Inventor: Ephraim Zehavi, Del Mar, Calif.

[73] Assignee: Qualcomm Incorporated, San Diego, Calif.

[21] Appl. No.: 11,619

[22] Filed: Feb. 1, 1993

[51] Int. Cl.⁶ .................. G06F 11/10; H03M 13/12
[52] U.S. Cl. ............................. 371/43; 375/308; 375/332
[58] Field of Search .................. 371/30, 43–45; 375/37, 39, 52, 53, 56, 57, 67, 83, 86

[56] References Cited

U.S. PATENT DOCUMENTS

| | | | |
|---|---|---|---|
| 3,789,360 | 1/1974 | Clark, Jr. et al. | |
| 4,447,908 | 5/1984 | Chevillat et al. | 375/67 |
| 4,462,101 | 7/1984 | Yasuda et al. | 371/43 |
| 4,586,182 | 4/1986 | Gallager | 371/43 |
| 4,713,817 | 12/1987 | Wei | 371/43 |
| 4,777,636 | 10/1988 | Yamashita et al. | 371/43 |
| 4,807,253 | 2/1989 | Hagenauer et al. | 375/57 |
| 4,823,346 | 4/1989 | Kobayashi et al. | 371/43 |
| 4,993,046 | 2/1991 | Saito et al. | 371/43 |
| 5,113,400 | 5/1992 | Gould et al. | 371/43 |
| 5,115,453 | 5/1992 | Calderbank et al. | 371/43 |
| 5,233,629 | 8/1993 | Paik et al. | 371/43 |
| 5,233,630 | 8/1993 | Wolf | 375/67 |

OTHER PUBLICATIONS

"Trellis-Coded MPSK Modulation for Highly Efficient Military Satellite Applications", Viterbi et al, *IEEE*, 1988, pp. 647–651.

"Practical Applications of TCM", Dehesh et al, *IEEE*, 1990, pp. 380–383.

"A 25 MHz Viterbi FEC Codec", Kerr et al, *1990 IEEE Custom Integrated Circuit Conference Proceedings*, May 13–16, 1990, pp. 13.6.1–13.6.5.

"A Pragmatic Approach to Trellis-Coded Modulation", Viterbi et al, *IEEE Communications Magazine*, pp. 11–19, Jul. 1989.

Primary Examiner—Roy N. Envall, Jr.
Assistant Examiner—Steven R. Garland
Attorney, Agent, or Firm—Russell B. Miller; Sean English

[57] ABSTRACT

A method and apparatus for trellis coding of input data as phase point data for M-ary modulation and transmission upon a communication channel and a method and apparatus for decoding same. The trellis encoding is accomplished by an input encoder for receiving and encoding according to a first encoding format a set of input user data bits to provide a set of symbols; a precoder for encoding according to a second encoding format a first symbol of the set symbols to provide a second symbol; an output encoder for encoding the second symbol according to a third encoding format to provide a third symbol wherein the third encoding format has an inverse transfer function relationship with the second encoding format, encoding the second symbol according to a fourth encoding format to provide a fourth symbol; and wherein remaining symbols of the set of symbols and the third and fourth symbols collectively represent phase point data. A decoder provides from received phase point data indicative of the trellis coded user data corresponding corrected estimates of the user data.

54 Claims, 4 Drawing Sheets

METHOD AND APPARATUS FOR RESOLVING PHASE AMBIGUITIES IN TRELLIS CODED MODULATED DATA

BACKGROUND OF THE INVENTION

I. Field of the Invention

The present invention relates to data communications. More particularly, the present invention relates to a novel and improved method and apparatus for resolving phase ambiguities in trellis coded modulated data.

II. Description of the Related Art

The field of data communications is concerned with raising the data throughput of a transmission system with a limited signal to noise ratio (SNR). The use of error correcting circuitry such as the Viterbi decoder allows system tradeoffs to be made with smaller SNRs or higher data rates to be used with the same bit error rate (BER). The decrease in the SNR needed is generally referred to as coding gain. Coding gain may be determined from simulated bit error performance curves. In a graph of simulated bit error performance curves the BER of uncoded and various code rate data is charted against $E_b/N_o$, where $E_b$ is the energy per bit and $N_o$ is the Gaussian White Noise energy per bit. The coding gain at any point along a bit error performance curve for a particular BER level is determined by subtracting the coded $E_b/N_o$ from the uncoded $E_b/N_o$. In the paper "Viterbi Decoding for Satellite and Space Communication", by J. A. Heller and I. M. Jacobs, IEEE Transactions on Communication Technology, Vol. COM-19, pgs. 835–848, October 1971, extensive results of simulations on various decoder apparatus were reported.

The coding rate and constraint length are used to define the Viterbi decoder. The coding rate (m/n) corresponds to the number of coding symbols produced (n) for a given number of input bits (m). The coding rate of ½ has become one of the most popular rates, although other code rates are also generally used. One class of codes with m≠1 are called punctured codes and are produced by discarding or erasing symbols from the rate 1/n code. The constraint length (K) is the length of the convolutional code used in the encoding of the data. A constraint length of K=7 is typical in convolutional coding schemes. The convolutional encoder can be thought of as an Finite Impulse Response (FIR) filter with binary coefficients and length K−1. This filter produces a symbol stream with $2^{K-1}$ possible states.

The basic principal of the Viterbi algorithm is to take a convolutionally encoded data stream that has been transmitted over a noisy channel and use the properties of the convolutional code to determine the transmitted bit stream. The Viterbi algorithm is a computationally efficient method of updating the conditional probabilities of all $2^{K-1}$ states and finding the most probable bit sequence transmitted. In order to compute this probability, all the conditional probabilities of $2^{K-1}$ states for each bit must be computed. The resulting decision from each of these computations is stored as a single bit in a path memory.

A chainback operation, an inverse of the encoding operation, is performed in which the $p \cdot 2^{K-1}$ decision bits are used to select an output bit, where p is the path memory depth. After many states the most probable path will be selected with a high degree of certainty. The path memory depth must be sufficiently long to allow this probability to approach 1. For a rate ½ code, an exemplary path memory depth is about (5·K), or 35 states. For a rate ⅞ punctured code the optimal depth increases to 96 states.

Constraint lengths of K less than 5 are too small to provide any substantial coding gain, while systems with K greater than 7 are typically too complex to implement as a parallel architecture on a single VLSI device. As the constraint length increases, the number of interconnections in a fully parallel computation section increases as a function of ($2^{K-1}$·L), where L is the number of bits of precision in the state metric computations. Therefore, where K is greater than 7, serial computation devices are generally used which employ large external random access memories (RAMs).

In the paper "Channel Coding with Multilevel/Phase Signal" by G. Ungerboeck, IEEE Transactions on Information Theory, Vol. IT-28, pgs. 55–67, January 1982, a trellis coded modulation (TCM) was described. In Ungerboeck it was shown that within a given spectral bandwidth, it is possible to achieve an Asymptotic Coding Gain of up to 6 dB by employing a rate (n−1)/n convolutional code and doubling the signal set. Unfortunately for each modulation technique and for each bit rate, the maximal coding again is achieved by a different convolutional code. Further disclosed were the results of a search for all convolutional codes for several rates and modulation techniques, and the best codes presented.

In the paper "A Pragmatic Approach to Trellis-Coded Modulation" by A. J. Viterbi, J. K. Wolf, E. Zehavi and R. Padovani, IEEE Communications Magazine, pgs. 11–19, July 1989, a pragmatic approach to trellis coded modulation (PTCM) was disclosed. The underlying concept therein is that a somewhat lower coding gain is achievable by a PTCM based on the "industry standard" rate ½, K=7 convolutional code. Although a lower coding gain is realized, it is very close to the coding gain of Ungerboeck at BERs of interest.

Trellis coding is an attractive coding technique since it possesses an aspect which other coding techniques lack. The power of trellis coding lies in the fact that even though no apparent coding operation is performed on any other bit than the least significant bit of the input data, the decoder is able to provide error correction on all bits. Generally the use of TCM techniques to achieve efficient use of power-bandwidth resources has been limited to low speed applications in digital signal processor implementations. The use of PTCM techniques enable VLSI implementations of an encoder/decoder capable of operating at high rates. A decoder using PTCM techniques is capable of handling different modulation techniques, such as M-ary phase-shift keying (M-ary PSK) including Binary PSK (BPSK), Quadrature PSK (QPSK), 8-PSK, and 16-PSK.

In any phase modulation system, a stable reference is required for coherent demodulation at the receiver. However in a M-ary PSK system, where there is no absolute phase reference, phase ambiguities in the transmitted data may occur in the transmission channel which must be resolved for proper decoding of the received data. Such phase ambiguities, or phase shifts, in the received data can be on the order of $2\pi/M$, $4\pi/M, \ldots, (M-1)(2\pi/M)$. All phase ambiguities other than integer multiples of $4\pi/M$ can be resolved by known techniques, typically monitoring the growth rate of the state metrics in the Viterbi decoder. However, such techniques do not enable resolution of the phase ambiguities that are integer multiples of $4\pi/M$. Therefore, the power of trellis coding has been unavailable to high speed data communication systems using M-ary PSK modulation.

It is therefore an object of the present invention to provide a novel method and system for resolving, in an M-ary PSK communication system, phase ambiguities of trellis coded modulated data that are integer multiples $4\pi/M$.

SUMMARY OF THE INVENTION

The present invention is a novel and improved method and apparatus which utilizes trellis coding in the encoding and decoding of data. In accordance with the present invention a trellis encoder and decoder are disclosed in which a circuit is provided that overcomes the problems of transmission phase ambiguities in M-ary PSK modulation for trellis coded data.

In an 8-PSK modulation scheme, using rate $\frac{2}{3}$ encoding, each input data bit set is comprised of two bits. In a 16-PSK modulation scheme, using rate $\frac{3}{4}$ encoding, each input data bit set is comprised of three bits. In a general M-PSK modulation scheme, using rate $(\log_2 M - 1)/\log_2 M$, each input data bit set is comprised of $\log_2 M - 1$ bits. The encoder receives a set of input data bits of a sequence of input data bit sets, differentially encodes the input data bit set, precodes one of the differentially encoded data bits by a function of $1/G_1(D)$, and then convolutionally encodes the precoded data bit separately by the functions $G_1(D)$ and $G_0(D)$ to produce a pair of resultant symbols. For 8-PSK modulation the other differentially encoded input data bit from each input data bit set is provided as the most significant bit of a transmission phase point value. The symbols resulting from the convolutional encoding are provided as the next-to-least and least significant bits of the transmission phase point value. For 16-PSK modulation the other two differentially encoded input data bits from each input data bit set are provided as the most significant bits of a transmission phase point value. The symbols resulting from the convolutional encoding are provided as the next-to-least and least significant bits of the transmission phase point value. For M-PSK modulation the other $\log_2 M - 2$ differentially encoded input data bits from each data bit set are provided as the most significant bits of a transmission phase point value. The two symbols resulting from the convolutional encoding are provided as the next-to-least and least significant bits of the transmission phase point value.

The decoder uses a Viterbi decoder to generate an error corrected estimate of the corresponding one bit of the original data. The Viterbi decoder uses branch metrics in the decoding process developed from information contained in the phase of the received signal. The Viterbi decoder output symbol is convolutionally encoded to produce corresponding symbols for use in the recovery of the other corresponding differentially encoded symbols. Differential decoding of the symbols is performed to recover estimates of the originally transmitted data bits. The symbol resulting from convolutional encoding according to the function $G_1(D)$ is provided as one input to a differential decoder. The re-encoded symbol pair is used in correcting phase shift corruption's in unprotected symbols transmitted in the sector value to provide a symbols(s) to the differential encoder. The differential decoder provides as an output an estimate of the input data set that was input to the encoder for transmission.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Convolutional encoding of data combined with a Viterbi decoder is a well known technique for providing error correction coding/decoding of data. As mentioned previously, although trellis coding provides a coding operation on only the least significant bit of the input data, the decoder is able to provide error correction on all bits. Therefore, trellis coding provides an advancement over convolutional coding of the input data alone in that all bits need not be coded in order to achieve error correction on all of the data bits.

In U.S. patent application Ser. No. 07/695,397 entitled "METHOD AND APPARATUS FOR RESOLVING PHASE AMBIGUITIES IN TRELLIS CODED MODULATED DATA", filed May 3, 1991, now U.S. Pat. No. 5,233,630 issued Aug. 3, 1993, and assigned to the assignee of the present invention, one technique for encoding and decoding trellis coded dated for resolving phase ambiguities in the data is disclosed. Furthermore in copending U.S. patent application Ser. No. 07/767,167 entitled "VITERBI DECODER BIT EFFICIENT CHAINBACK MEMORY METHOD AND DECODER INCORPORATING SAME", filed Sep. 27, 1991, by the inventor hereof and assigned to the assignee of the present invention, a technique is disclosed for decoding transmitted trellis coded data. The present invention provides an alternate technique for resolving the phase ambiguities that result from phase shifts in transmitted trellis coded data.

Figure 1:
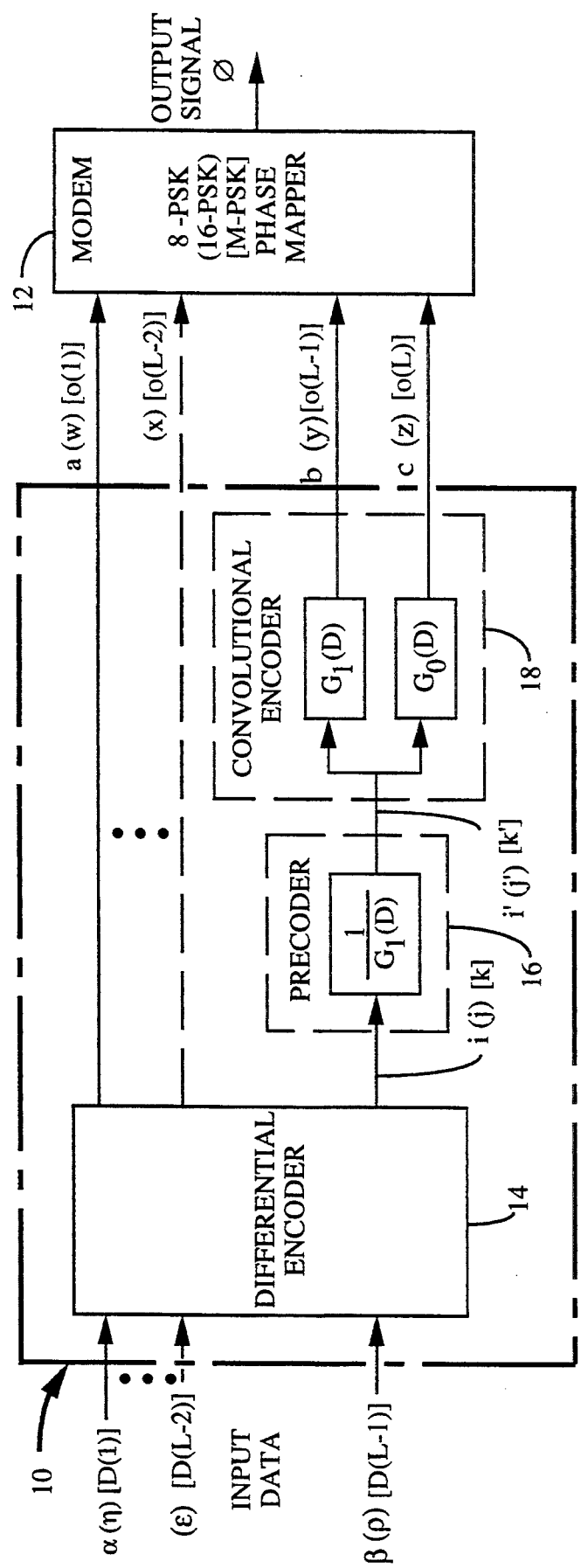
FIG. 1 is a block diagram of an exemplary trellis encoder with a precoder circuit for phase ambiguity resolution encoding.

FIG. 1 illustrates in block diagram form an exemplary trellis coded modulation (TCM) encoder 10 which may be configured for any M-PSK modulation where no phase reference is provided. For 8-PSK modulation, encoder 10 receives a two-bit set of input data ($\alpha$, $\beta$) and generates a corresponding three-bit phase point value (a, b, c). For 16-PSK modulation, encoder 10 receives a three-bit set of input data ($\eta$, $\epsilon$, $\rho$) and generates a corresponding four-bit phase point value (w, x, y, z). For M-PSK modulation, encoder 10 receives a $\log_2 M - 1$ bit set (D(1),D(2) . . . D(L−1)) and generates a $\log_2 M$ phase point value (o(1),o(2) . . . , o(L)). The number of bits in the output bit set will be referred to as L and equal to $\log_2 M$.

Figure 4:
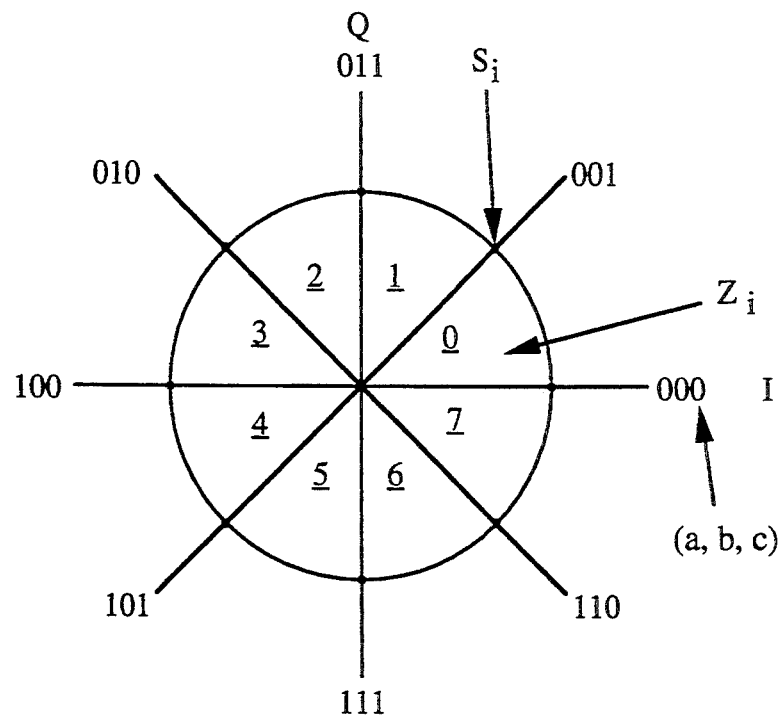
FIG. 4 is a graph illustrating the signal space for 8-PSK modulation.

The phase point value is output from encoder 10 to an 8-PSK phase mapper or modem 12 where the phase of a carrier signal is shifted in accordance with the three bit phase point value (a,b,c) and the mapping to the signal space as depicted in FIG. 4. The output of modem 12 is the phase shifted carrier signal ($\phi$) where:

$$\phi = A \cos(2\pi f_c t + \theta). \tag{1}$$

where:
- A is the signal amplitude (typically a constant),
- $f_c$ is the carrier frequency, and
- $\theta$ is the phase offset corresponding to the three-bit phase point value (a,b,c), and for 8-PSK:

$$\theta = (a \cdot 180°) + (b \cdot 90°) + ((b-c)^2 \cdot 45°). \tag{2}$$

Modem 12 may be configured as a conventional phase shift keyed (PSK) digital transmission modem using phase shift techniques well known in the art. For example modem 12 is typically configured to transmit the carrier signal in the form according to equation (1). Using the well known trigonometry formula:

$$\cos(x+y) = (\cos x \cdot \cos y) - (\sin x \cdot \sin y), \tag{3}$$

a M-ary PSK modem structure may be implemented using an I and Q constellation corresponding to FIG. 4 to represent the carrier phase shift where:

$$I = A \cos \theta, \text{ and} \tag{4}$$

$$Q = A(-\sin \theta). \tag{5}$$

The I component is mixed directly with the carrier (cos $2\pi f_c t$) in a first mixer while the Q component is mixed with a 90° phase shifted carrier (sin $2\pi f_c t$) in a second mixer. The result of each signal mixing is summed in a summer to produce the signal $\phi$ where:

$$\phi = A \cos(2\pi f_c t + \theta) = A((\cos\theta \cdot \cos 2\pi f_c t) - (\sin\theta \cdot \sin 2\pi f_c t)) \tag{6}$$

or $$\phi = A \cos(2\pi f_c t + \theta) = A((I \cdot \cos 2\pi f_c t) + (Q \cdot \sin 2\pi f_c t)). \tag{7}$$

Modem 12 may also be configured to include circuitry for converting the baseband signal to RF frequencies, RF transmission circuitry and an antenna system as is well known in the art.

Encoder 10 in an exemplary form configured for 8-PSK modulation is comprised of mod $2^k$ differential encoder 14, precoder 16 and encoder 18. Encoder 10 is configured with the individual elements thereof of conventional design. For 8-PSK modulation, data is input to encoder 10 two bits at a time.

Each two-bit input of the data bits ($\alpha$, $\beta$) is provided to differential encoder 14 where the bits are differentially encoded. In this example, differential encoder 14 is configured as a four-phase or quadrature differential encoder. Techniques for quadrature differential encoding of the bits ($\alpha$, $\beta$) along with circuit designs for this type of differential encoder are well known in the art. Each resultant differentially encoded symbol pair (a, i) corresponding to an input bit pair ($\alpha$, $\beta$) is output from differential encoder 14. The symbol a is provided as one input to modem 12 as the most significant bit of a three-bit phase point value (A, B, C) while the symbol i is provided to precoder 16.

Figure 2:
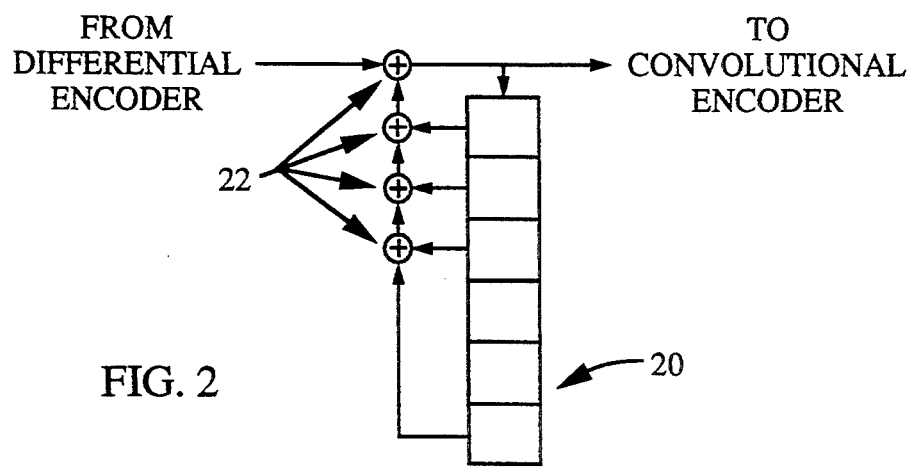
FIG. 2 is a block diagram illustrating in further detail the exemplary precoder circuit of FIG. 1.

Precoder 16 encodes the symbol i according to the transfer function $1/G_1(D)$ to provide the symbol i'. The encoded symbol i' is output from precoder 16 as an input to encoder 18. FIG. 2 illustrates in further detail an exemplary configuration for precoder 16. As illustrated in FIG. 2, precoder 16 is formed by tapped shift register 20 having individual tapped register elements and a set of modulo-2 adders 22 interconnected according to a defining polynomial of 1/171 (octal).

Encoder 18 in the exemplary embodiment is a rate $\frac{1}{2}$, K=7 convolutional encoder which convolutionally encodes each input symbol i' according to the transfer function of $G_1(D)$ and $G_0(D)$ so as to respectively provide the output symbols b and c. It should be noted that since the symbol i is encoded in sequence by the transfer function of $1/G_1(D)$ in precoder 16 and $G_1(D)$ in encoder 18 to produce the symbol b, the value of the symbol b is the same as symbol i.

Figure 3:
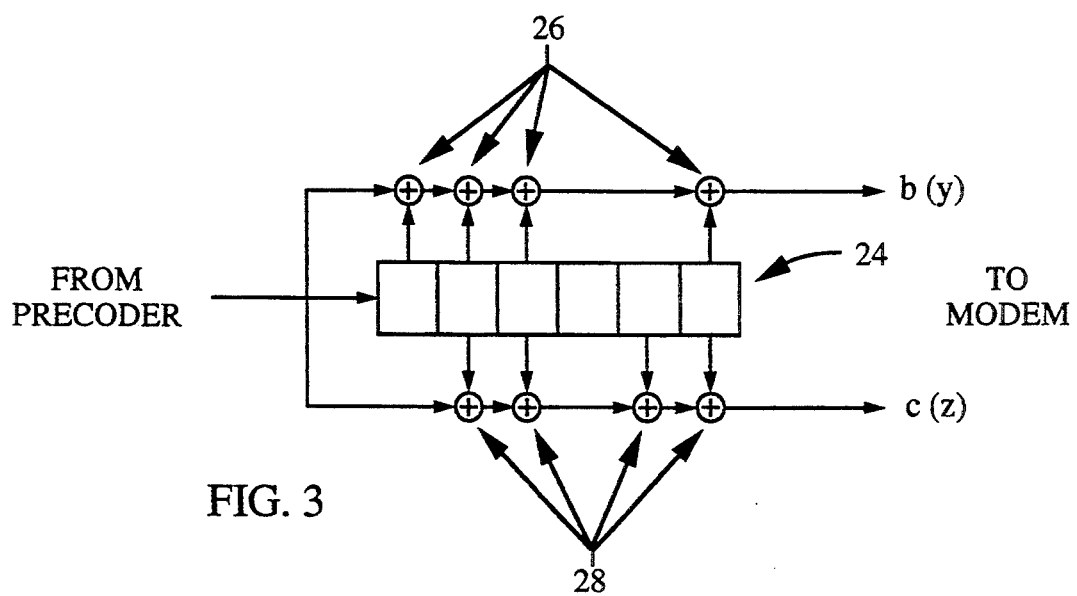
FIG. 3 is a block diagram illustrating in further detail the convolutional encoder of FIG. 1.

Techniques for the convolutional encoding of symbol i, along with circuit designs for convolutional encoders, are well known in the art. As illustrated in FIG. 3, encoder 18 is comprised of tapped shift register 24 and a first set of modulo-2 adders 26 interconnected according to a defining polynomial of 171 (octal) so as to generate the symbol b. A second set of modulo-2 adders 26 are also connected to shift register 24 according to a defining polynomial 133 (octal) to generate the symbol c. The symbols (b, c) are then provided to modem 12 from encoder 18 along with the corresponding symbol a from differential encoder 14. The symbols (b, c) as output from encoder 18 to modem 12 form the next-to-least and least significant bits of the three-bit phase point value (a, b, c) respectively.

Although the defining polynomials for precoder 16 and encoder 18 are provided by way of example, other defining polynomials may be used. Regardless of the transfer functions defining precoder 16 and encoder 18, it is important that the defining polynomial of precoder 16 have an inverse relationship with one of the defining polynomials of encoder 18. Preferably the polynomial of encoder 18 having the inverse relationship with precoder 16 is used to generate the more significant symbol of the two symbols generated by encoder 18 in the three-bit phase point value.

Encoder 10 of FIG. 1 in using precoder 16 and convolutional encoder 18 having an inverse transfer relationship for one of the encoded symbols permits decoding of the transmitted data so as to overcome phase ambiguities caused by the transmission channel. Phase ambiguities of 45°, 135°, 225° and 315° are resolved at the decoder by monitoring the Viterbi decoder state metric growth rate, i.e. normalization rate, and providing a branch metric shift along with a shift in the received sector value. The use of precoder 16 in the encoding process facilitates the resolution of phase ambiguities of 90°, 180° and 270° at the decoder.

Modem 12 assembles the symbols a, b and c in order with the symbols a and c respectively being the most significant and least significant bits of a three-bit phase point value. Modem 12 provides the shifted phase carrier signal ($\phi$) as discussed below.

FIG. 4 illustrates the signal space for 8-PSK modulation for trellis coded data. The signals used in 8-PSK modulation are proportional to:

$$S_i = \exp\left(j\frac{\pi i}{4}\right) \quad (8)$$

for i=0, 1, ..., 7, where the signal space is defined by eight sectors $Z_i$ such that the signal $S_i$ falls at the beginning of a sector $Z_i$. In FIG. 4, the sectors $Z_i$ are numbered as indicated by the corresponding underlined numeral within each sector. It should be understood that various numbering schemes may be used for the sector numbers and the one provided herein is merely for illustration purposes.

The phase of any point within sector $Z_i$ can be expressed by the following relationship:

$$\frac{\pi i}{4} \leq \phi < \frac{\pi(i+1)}{4} \quad (9)$$

for i=0, 1, ..., 7.

In the 8-PSK modulation scheme, each sector $Z_i$ in which the signal $S_i$ corresponds is represented in binary form by a three-bit binary sector value (a, b, c) representative of that sector according to the exemplary mapping scheme illustrated in FIG. 4 and Table I. In other words, the bit A which is the most significant bit of the sector value (A,B,C), identifies the half plane, while the bits (B, C) identify the sector within the half plane.

With reference to signal transmission, the bits (a, b, c) represent a phase point value for carrier phase modulation as set forth in equation (2). In the transmission scheme a modified gray code is preferably used with respect to phase points value mapping. As an example, a phase point value (a, b, c) of 111 would correspond to a phase shift θ of 270° in the carrier as transmitted.

In the absence of channel interference the transmitted phase shift θ would be the same as the received phase shift θ. Typically however, channel interference may provide a phase shift in the received signal from that of the transmitted signal. Thus the phase shift of the signal as received is different from the transmitted signal due to a channel interference induced phase shift. In order to accommodate these shifts in phase the sector mapping scheme is employed. At the decoder the received signal, whose phase falls within a sector of the mapping scheme of FIG. 4, is assigned a corresponding sector value. In the example above, a received signal having a phase shift between 270°-315° would fall within sector number 6 ($Z_6$) and would correspond to a three-bit binary sector value of 110. Table I provides a correlation between sector numbers and sector values in the exemplary configuration.

TABLE I

| SECTOR NUMBER | SECTOR VALUE |
|---|---|
| 0 | 000 |
| 1 | 001 |
| 2 | 010 |
| 3 | 011 |
| 4 | 100 |
| 5 | 101 |
| 6 | 110 |
| 7 | 111 |

It should be understood that each sector value corresponds to one sector, or wedge, of the IQ planes of FIG. 4. It is critical to understand that the sector values are not the same as traditional "decision regions". Decision regions are generally centered on the transmitted phase points, while in this discussion sectors are immediately counter-clockwise from the phase points. Decision regions normally associated with PSK modem designs are not relevant to the present discussion.

In a communication system which utilizes TCM with M-ary PSK modulation without an absolute phase reference, the receiver (decoder) phase can differ from the transmitter (encoder) phase, i.e. a phase shift in the transmitted data with respect to the received data, as discussed above. In the case of 8-PSK modulation, the receiver may differ from the transmitter phase by 0°, 45°, 90°, 135°, 180°, 225°, 270° or 315°.

The phase shifts of 45°, 135°, 225° and 315° are detected by a Viterbi or convolutional decoder at the receiver since in these cases the effective error rate of the channel in the absence of noise is high. A technique used for detecting these particular phase shifts is monitoring the growth of the state metrics, i.e the normalization rate of the state metrics is abnormally high. Upon detecting this phase condition, correction may be made by shifting the branch metrics and sector value by simply stepping ahead by $\pi/4$ in the signal space.

Phase shifts of 90°, 180° and 270° are undetected by the Viterbi decoder and thus must be corrected by other means. Table II illustrates the transmitted data and corresponding received data for phase shifts in increments of 90°.

TABLE II

| TRANSMITTED SYMBOLS (a, b, c) | RECEIVED SYMBOLS (â, b̂, ĉ) | | |
|---|---|---|---|
| 0° | 90° | 180° | 270° |
| 000 | 011 | 100 | 111 |
| 001 | 010 | 101 | 110 |
| 011 | 100 | 111 | 000 |
| 010 | 101 | 110 | 001 |
| 100 | 111 | 000 | 011 |
| 101 | 110 | 001 | 010 |
| 111 | 000 | 011 | 100 |
| 110 | 001 | 010 | 101 |

From Table II, it can be seen that the two least significant symbols of the received phase point, the symbols b̂ and ĉ, are always either the right sense or inverted when a phase shift is experienced in the transmission channel. In the case of a 180° phase shift the uncoded symbol â is always inverted with respect to the corresponding transmitted bit. However for phase shifts of 90° and 270° only certain ones of the uncoded symbol â are inverted. For purposes of illustration in Table I, each occurrence of an inverted uncoded bit â is highlighted.

As mentioned previously, the power in trellis coding lies in that even though no apparent coding operation has been performed on any bit other than the least significant bit of the input data, the decoder is still able to provide error correction on all bits. In order to support this property of trellis coding the received signal information provided to the decoder is used to determine how far the signal is from each of the eight possible receiver phases for 8-PSK modulation (sixteen for 16-PSK and M for M-PSK). The decoder uses this distance information in the decision making process to make a decision about all bits in the data.

Figure 5:
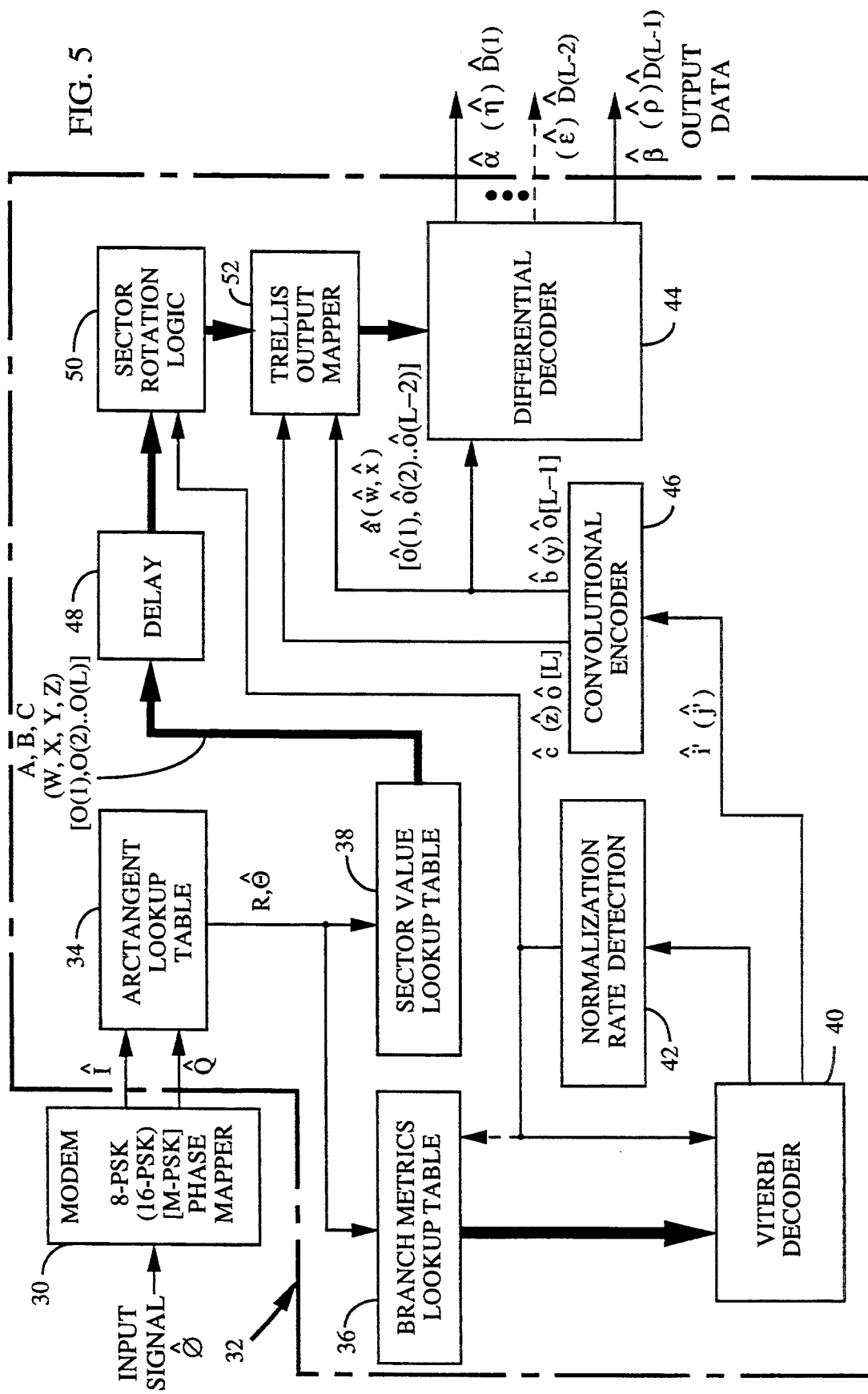
FIG. 5 is a block diagram of a trellis decoder capable of resolving phase ambiguities.

FIG. 5 illustrates an exemplary embodiment of a modem 30 and TCM decoder 32 of the present invention configured for demodulation of an 8-PSK, 16-PSK or M-PSK signal where no phase reference is provided.

TCM decoder 32 as illustrated in FIG. 5 is a variant of Viterbi decoder Part No. Q1875 of QUALCOMM Incorporated of San Diego, Calif., which is described in further detail in copending application Ser. No. 07/767,167. Modem 30 receives the phase shifted carrier signal $\hat{\phi}$ which contains information in the form of the phase shift in the carrier. However channel conditions may arise which can result in a phase shift in the transmitted signal $\phi$. The received signal $\hat{\phi}$ may be expressed by the following equation:

$$\hat{\phi} = \hat{A} \cos(2\pi f_c t \hat{\theta}) = \hat{A} \cos(2\pi f_c t + \theta + \psi) \quad (10)$$

where $\psi$ is the phase shift induced by the transmission channel.

Modem 30 converts the received signal $\hat{\phi}$ to quantized I and Q components where:

$$\hat{\phi} = I \cos(2\pi f_c t) + Q \sin(2\pi f_c t). \quad (11)$$

The I and Q components are provided to decoder 32 where converted to a three-bit sector value (A, B, C) for 8-PSK modulation, a four-bit sector value (W, X, Y, Z) for 16-PSK modulation or an L-bit sector value (O(1), O(2), ... ,O(L)). The sector value (A, B, C) is again related to the phase of the received signal in accordance with Table 1. Modem circuitry and techniques well known in the art may be utilized to convert the phase of the received signal to I and Q components. Modem 30 may further include an antenna system, RF circuitry and frequency downconversion circuitry necessary to convert the received signal to baseband as is well known in the art.

Modem 30 provides an output of the I and Q components to decoder 32 for decoding and error correction. Decoder 32 is comprised of arctangent lookup table 34; branch metrics lookup table 36; sector value lookup table 38; Viterbi decoder 40; normalization rate detection circuitry 42; differential decoder 44; convolutional encoder 46; delay circuit 48; sector rotation logic 50; and trellis decision circuit or output mapper 52. It should be understood that the functions of lookup tables 34, 36 and 38 along with the branch metric rotation function may be accomplished by using a processor with appropriate memory and program instructions.

Viterbi decoder 40 in an exemplary implementation is typically comprised of an input processor section (not shown) which may include a branch metrics rotation logic; state metrics computational section (not shown) and decision chainback computational section (not shown). In an equally applicable configuration Viterbi decoder 40 may be in a form of one of the many commercially available devices using external branch metric rotation logic which may be associated with lookup table 36, or the function may be performed by a processor for computing the branch metrics.

The I and Q components from modem 30 are provided to arctangent lookup table 34 which is typically implemented as a read only memory (ROM) which stores values of $\hat{\theta}$ and amplitude values R corresponding to the I and Q values which address the memory.

Each value of $\hat{\theta}$ output from lookup table 34 is provided to branch metrics lookup table 36 and sector value lookup table 38, also typically in ROM form. The value of R corresponding to each value of $\hat{\theta}$ is also provided to lookup table 36. Lookup tables 36 and 38 respectively store branch metrics and a three-bit sector value corresponding to each value of $\hat{\theta}$, the value $\hat{\theta}$ being to address the memories. With reference to FIG. 5, for a received value of $\hat{\theta}$ which falls within a particular sector the corresponding sector number is output from lookup table 38 to delay circuit 48. Similarly, for a received value of $\hat{\theta}$ corresponding branch metrics are output from lookup table 36 to the input processor section of Viterbi decoder 40. Further details on an exemplary relationship between the received value of $\hat{\theta}$ and the corresponding branch metrics is provided in copending application Ser. No. 07/767,167.

In an exemplary implementation of the TCM decoder which provides greater user flexibility, the branch metrics are determined outside of Viterbi decoder 40 using an external branch metric lookup table, lookup table 36. It should be understood however, that in other implementations of Viterbi decoder 40 the branch metrics may be determined within Viterbi decoder 40 using an internal branch metric lookup table. In the case of the internal branch metric generation only the $\hat{\theta}$ value, and possibly the amplitude value R, need be provided thereto.

The branch metrics are provided as an output from lookup table 36 as an input to the input processor section of Viterbi decoder 40. The input processor section may include branch metric rotation logic whose function is described in further detail later herein. The input processor section is of conventional design for providing input sample timing and synchronization. Furthermore the input processor section may provide internal branch metrics for use of Viterbi decoder 40 outside of the trellis mode in other circuits for the decoding of data of various other coding rates. The branch metrics are provided from input processor section to the state metrics computational section.

The state metrics computational section is a standard add, compare, and select circuit as is well known in the art. An example of such a circuit is found in Viterbi decoder Part Nos. Q0256 and Q1850 of QUALCOMM Incorporated of San Diego, Calif. The values output from the state metrics computational section are provided to a decision chainback computational section. Also provided as an output from the state metrics computational section is a signal indicative of the growth of the state metrics. This signal is provided to normalization rate detection circuitry 42.

As is known in the art of Viterbi decoders, using the normally selected branch metrics for 8-PSK modulation, under channel phase shift conditions of 45°, 135°, 225° and 315° the Viterbi decoder would produce erroneous estimates of the original data. Further as is known, Viterbi decoders alone are not capable of detecting that the data is in error as a result of these conditions of channel phase shift. Normalization rate detection circuitry 42 is thus used to detect an abnormally high normalization rate indicative of channel phase shifts of 45°, 135°, 225° and 315°. Upon a detection of the abnormally high growth rate of the state metrics, normalization rate detection circuitry 42 provides a phase shift signal to the input processor section of Viterbi decoder 40 and to sector rotation logic 50. To correct for this condition, the branch metric rotation logic which in this example is located within the input processor section of Viterbi decoder 40 is responsive to the phase shift signal so as to provide a shift in the branch metrics corresponding to a shift of $\pi/4$ in the signal space, i.e., branch metrics corresponding to a 45° degree shift in the signal space. In an alternative configuration in which the branch metric rotation function is performed in outside of Viterbi decoder 40, such as in conjunction with lookup table 36. In this example the indication from normalization rate detection circuitry 42 is provided to lookup table 36 (via the dashed line).

Furthermore as discussed later herein the phase shift signal is used by sector rotation logic to provide a corresponding $\pi/4$ shift in the signal space for the sector value bits (A, B, C). A $\pi/4$ shift in the sector value results in the sector value corresponding to a phase shift of 0°, 90°, 180° and 270°. Undergoing one of the phase shifts, Viterbi decoder 40 is then capable of recovering the data.

Viterbi decoder 40 provides as an output to convolutional encoder 46 a best estimate $\hat{i}'$ of the transmitted data symbol $i'$. Convolutional encoder 46 re-encodes the symbol $i'$ according to the same polynomial functions G1(D) and G0(D) as that of encoder 18 of FIG. 1, e.g., the respective polynomials 171 and 133. Convolutional encoder 46 thus produces the symbols $(\hat{b}, \hat{c})$ which are corrected estimates of the transmitted phase point bits (b, c). The symbols $(\hat{b}, \hat{c})$ are output from convolutional encoder 46 to trellis output mapper 52.

As discussed with reference to FIG. 1 the symbol $i'$ is representative of the symbol i precoded by the function 1/G1(D). Upon decoding of the received signal by Viterbi decoder 40 the estimate $\hat{i}'$ produced is related to an estimate of the symbol $\hat{i}$ by the function of G1(D). Thus by re-encoding the estimate $\hat{i}'$ by the function G1(D) the estimate of the symbol i is produced. Since convolutional encoder 46 performs this function the symbol $\hat{b}$ is the same as the symbol $\hat{i}$, which is the best estimate of the symbol i of FIG. 1 the input symbol to precoder 16. This symbol $\hat{b}$ is provided to four-phase differential decoder 54 as the symbol $\hat{i}$, or in the alternative provided through trellis output mapper 52 to differential decoder 54.

Lookup table 38 in response to the received phase value $\hat{\theta}$ assigns a three bit sector value (A, B, C) to the received phase value $\hat{\theta}$. This sector value (A, B, C) corresponds to the sector in which the signal phase value $\hat{\theta}$ fell as illustrated in FIG. 4 and Table I.

The sector value (A, B, C) output from lookup table 38 is provided to delay circuit 48 for providing a delay in the propagation of the sector value. This delay provides correspondence between the output of lookup table 38 and the output of Viterbi decoder 40, which are based upon the same phase value input, due to the computational time required by the Viterbi decoder 40. Delay circuit 48 may be configured merely as a series of logic gates to provide propagation delay as is well known in the art.

The delayed sector value (A, B, C) is provided as an input to sector rotation logic 50. As mentioned previously, also provided as an input to sector rotation logic 50 is the phase shift signal from normalization rate detection circuitry 42. Sector rotation logic 50 is responsive to the phase shift signal for rotating the sector value by $\pi/4$. For example, a selected sector value of (001) would be rotated to (010). Sector rotation logic 50 may be configured using conventional Karnaugh mapping techniques to provide the appropriate output sector value for a corresponding input sector value in both the normal and phase shift conditions. As an alternative sector rotation logic may be implemented as a ROM in which under normal conditions the stored output sector value corresponds to the input sector value. However in response to the phase shift signal the output sector value from the ROM corresponds to the shifted sector value.

The output sector value from sector rotation logic 50 is provided to trellis output mapper 52 along with the re-encoded symbols $(\hat{b}, \hat{c})$ from convolutional encoder 46. Trellis output mapper 52 provides in response to the sector value bits (A, B, C) and the re-encoded symbols $(\hat{b}, \hat{c})$ an output symbol $\hat{a}$ which corresponds to a corrected estimate of the most significant bit of the originally transmitted phase point, the uncoded symbol a. The symbol $\hat{a}$ is determined in trellis output mapper 52 in accordance with Table III.

TABLE III

| SECTOR NO. | SECTOR VALUE (A, B, C) | $(\hat{b}, \hat{c})$ (0,0) $\hat{a} =$ | (0,1) $\hat{a} =$ | (1,1) $\hat{a} =$ | (1,0) $\hat{a} =$ |
|---|---|---|---|---|---|
| 0 | 000 | 0 | 0 | 0 | 1 |
| 1 | 001 | 0 | 0 | 0 | 0 |
| 2 | 010 | 1 | 0 | 0 | 0 |
| 3 | 011 | 1 | 1 | 0 | 0 |
| 4 | 100 | 1 | 1 | 1 | 0 |
| 5 | 101 | 1 | 1 | 1 | 1 |
| 6 | 110 | 0 | 1 | 1 | 1 |
| 7 | 111 | 0 | 0 | 1 | 1 |

An example of the decision process for the symbol $\hat{a}$ is as follows. For purposes of this example there is no phase shift which causes a branch metric or sector rotation, or of a nature which requires other phase ambiguity correction. The received signal is of a phase of 100°. Using FIG. 4 and Table III, this received phase corresponds to a sector number and sector value respectively of 2 and 010. If the re-encoded symbol $\hat{i}'$ provides symbols $(\hat{b}, \hat{c})$ of (0,1), then the two possible received phase points correspond to 001 and 101. Since the received phase of 100° is located in a sector which is closer to phase point 001 than to phase point 101, the bit $\hat{a}$ is determined to be 0. Thus value of bit $\hat{a}$ output from trellis output mapper 52 for this case is 0.

The output symbol $\hat{a}$ from trellis output mapper 52 is provided to differential decoder 44 along with the re-encoded bit $\hat{b}$ (which is the bit $\hat{i}$) from convolutional encoder 46. Using the best estimates of the symbols $(\hat{a}, \hat{b})$, differential decoder 44 performs a four-phase differential decoding operation. The resultant output from differential decoder 44 are the estimates of the transmitted data bits $\hat{\alpha}$ and $\hat{\beta}$, with these estimates respectively denoted by the reference characters $\alpha$ and $\beta$.

The present invention is equally applicable to resolving phase ambiguities that may occur in the transmission of 16-PSK modulated trellis coded data. Referring back to FIG. 1, encoder 10 and modem 12 are configured for 16-PSK modulation as previously mentioned. In this implementation encoder 10 receives the three-bit set of input data $(\eta, \epsilon, \rho)$ and generates a corresponding four-bit phase point value (w, x, y, z).

Figure 6:
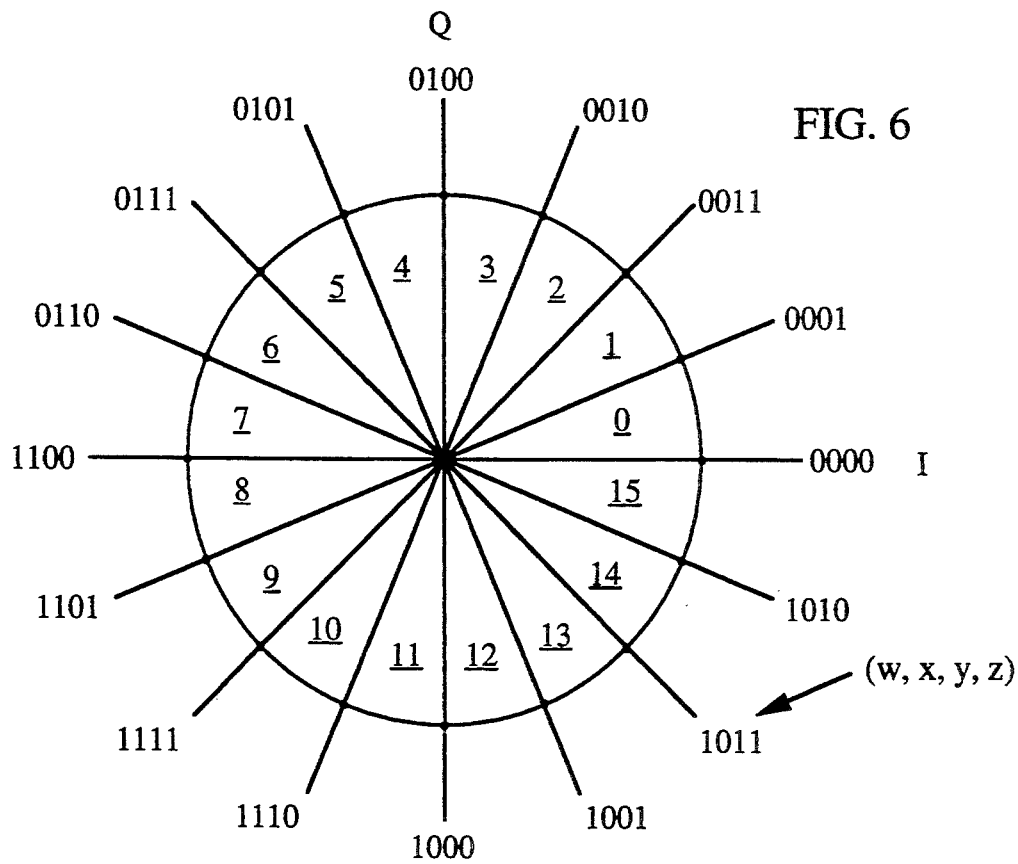
FIG. 6 is a graph illustrating the signal space for 16-PSK modulation.

The phase point value is output from encoder 10 to a 16-PSK phase mapper or modem 12 where the phase of a carrier signal is shifted in accordance with the four-bit phase point value (w, x, y, z) and the mapping to the signal space as depicted in FIG. 6. The output of modem 12 is the phase shifted carrier signal ($\phi$) as determined according to equation 1 where:

$$\theta = (w \cdot 180°) + ((w-x) \cdot 2 \cdot 90°) + (y \cdot 45°) + ((y-z) \cdot 2 \cdot 22.5°). \quad (12)$$

Other than the difference in mapping as set forth by using equation 12 over equation 2, modem 12 operates in the same manner as that discussed previously with reference to the 8-PSK modulation.

Data is input to encoder 10 three bits at a time, bits ($\eta$, $\epsilon$, $\rho$), to an eight-phase or octal differential encoder 14. Differential encoder 14 differentially encodes each input bit triplet ($\eta$, $\epsilon$, $\rho$) to provide a corresponding resultant output symbol triplet (w, x, j). Techniques for octal differential encoding of the bits ($\eta$, $\epsilon$, $\rho$) along with circuit designs for this type of differential encoder is well known in the art. The symbols (w, x) are provided to modem 12 as the most significant and next-to-most bits of the four-bit phase point value while the symbol j is provided to precoder 16.

Precoder 16 again encodes the symbol j according to the transfer function $1/G_1(D)$ to provide the symbol j'. The encoded symbol j' is output from precoder 16 to encoder 18. Precoder 16 is identical in construction as discussed above with reference to FIG. 2 with a defining exemplary polynomial of 1/171 (octal).

Convolutional encoder 18 again in the exemplary embodiment is a rate $\frac{1}{2}$, K=7 convolutional encoder which convolutionally encodes each input bit j' according to the transfer function of $G_1(D)$ and $G_0(D)$ so as to respectively provide the output symbols y and z. It should again be noted that since the symbol j is encoded in sequence by the transfer function of $1/G_1(D)$ in precoder 16 and $G_1(D)$ in encoder 18 to produce the symbol y, the value of the symbol y is the same as symbol j. Again for this example the defining polynomials for the transfer functions of $G_1(D)$ and $G_0(D)$ are respectively 171 (octal) and 133 (octal). The symbols (y, z) output from encoder 10 are provided as inputs to modem 12 as the next-to-least and least significant bits of the four-bit phase point value (w, x, y, z).

Encoder 10 of FIG. 1 in using precoder 16 and convolutional encoder 18 having an inverse transfer relationship for one of the encoded symbols permits decoding of the transmitted data so as to overcome phase ambiguities caused by the transmission channel. Phase ambiguities of 22.5°, 67.5°, 112.5°, 157.5°, 202.5°, 247.5°, 292.5°, and 337.5° are resolved at the decoder by monitoring the Viterbi decoder state metric growth rate and providing a branch metric shift along with a shift in the sector value. The use of precoder 16 in the encoding process facilitates the resolution of phase ambiguities of 45°, 90°, 135°, 180°, 225°, 270° and 315° at the decoder.

In FIG. 6 a representation of the signal space for 16-PSK modulation is provided. The signal space is divided up into sixteen sectors each identified by a corresponding sector number 0–15. Associated with each sector is a four-bit phase point (transmission) or sector value (reception). As in the case for 8-PSK modulation scheme, in the 16-PSK modulation each sector in which the received signal corresponds is represented in binary form by a four-bit sector value (W, X, Y, Z) representative of that sector according to the exemplary mapping scheme illustrated in FIG. 6 and Table IV. Table IV provides a correlation between sector numbers and sector values.

TABLE IV

| SECTOR NUMBER | SECTOR VALUE |
|---|---|
| 0 | 0000 |
| 1 | 0001 |
| 2 | 0010 |
| 3 | 0011 |
| 4 | 0100 |
| 5 | 0101 |
| 6 | 0110 |
| 7 | 0111 |

TABLE IV-continued

| SECTOR NUMBER | SECTOR VALUE |
|---|---|
| 8 | 1000 |
| 9 | 1001 |
| 10 | 1010 |
| 11 | 1011 |
| 12 | 1100 |
| 13 | 1101 |
| 14 | 1110 |
| 15 | 1111 |

In the case of 16-PSK modulation, the receiver may differ from the transmitter phase by 0°, 22.5°, 45°, 67.5°, 90°, 112.5°, 135°, 157.5°, 180°, 202.5°, 225°, 247.5°, 270°, 292.5°, 315°, or 337.5°. Phase shifts of 22.5°, 67.5°, 112.5°, 157.5°, 202.5°, 247.5°, 292.5°, 315°, or 337.5° are detected at the receiver by a Viterbi decoder since in these cases the effective error rate of the channel in the absence of noise is again very high. Again a technique used for detecting these particular phase shifts is monitoring the growth of the state metrics, i.e the normalization rate of the state metrics is abnormally high. Upon detecting this phase condition, correction may be made by shifting the branch metrics, such as by simply stepping ahead by $\pi/8$ in the signal space.

However, phase shifts of 45°, 90°, 135°, 180°, 225°, 270° and 315° are undetected by the Viterbi decoder and thus other means must be utilized to correct for these conditions. Table V illustrates the transmitted data and corresponding received data for phase shifts in increments of 45°. Since only a phase shift of 45°, 90°, 135°, 180°, 225°, 270° and 315° and no other noise is assumed in this discussion, the symbols ($\hat{w}$, $\hat{x}$, $\hat{y}$, $\hat{z}$) can be used to refer to either the received phase point or the corresponding sector value.

TABLE V

| TRANSMITTED BITS (w, x, y, z) | RECEIVED BITS ($\hat{w}$, $\hat{x}$, $\hat{y}$, $\hat{z}$) | | | | | | |
|---|---|---|---|---|---|---|---|
| 0° | 45° | 90° | 135° | 180° | 225° | 270° | 315° |
| 0000 | 0011 | 0100 | 0111 | 1100 | 1111 | 1000 | 1011 |
| 0001 | 0010 | 0101 | 0110 | 1101 | 1110 | 1001 | 1010 |
| 0011 | 0100 | 0111 | 1100 | 1111 | 1000 | 1011 | 0000 |
| 0010 | 0101 | 0110 | 1101 | 1110 | 1001 | 1010 | 0001 |
| 0100 | 0111 | 1100 | 1111 | 1000 | 1011 | 0000 | 0011 |
| 0101 | 0110 | 1101 | 1110 | 1001 | 1010 | 0001 | 0010 |
| 0111 | 1100 | 1111 | 1000 | 1011 | 0000 | 0011 | 0100 |
| 0110 | 1101 | 1110 | 1001 | 1010 | 0001 | 0010 | 0101 |
| 1100 | 1111 | 1000 | 1011 | 0000 | 0011 | 0100 | 0111 |
| 1101 | 1110 | 1001 | 1010 | 0001 | 0010 | 0101 | 0110 |
| 1111 | 1000 | 1011 | 0000 | 0011 | 0100 | 0111 | 1100 |
| 1110 | 1001 | 1010 | 0001 | 0010 | 0101 | 0110 | 1101 |
| 1000 | 1011 | 0000 | 0011 | 0100 | 0111 | 1100 | 1111 |
| 1001 | 1010 | 0001 | 0010 | 0101 | 0110 | 1101 | 1110 |
| 1011 | 0000 | 0011 | 0100 | 0111 | 1100 | 1111 | 1000 |
| 1010 | 0001 | 0010 | 0101 | 0110 | 1101 | 1110 | 1001 |

From Table V, it can be seen that the two least significant bits of the received phase point, symbol $\hat{y}$, and $\hat{z}$, are again always either the right sense or inverted when a phase shift is experienced in the transmission channel. However, for phase shifts of 45°, 135°, 225° and 315° one, both or neither of the symbols $\hat{w}$ and $\hat{x}$ are complemented. For a phase shift of 90°, 180° and 270° the coded symbols ($\hat{y}$, $\hat{z}$) are correct while for phase shifts of 45°, 135°, 225° and 315° the coded symbols ($\hat{y}$, $\hat{z}$) are mapped to their inverse with respect to the corresponding transmitted bits. For purposes of illustration in Table II, each occurrence of where one or both of the uncoded symbols ($\hat{w}$, $\hat{x}$) is complemented highlighted.

Referring back to FIG. 5, modem 30 and TCM decoder 32 of the present invention are also readily configured for demodulation of a 16-PSK modulated signal where no phase reference is provided. Modem 30 again receives the phase shifted carrier signal $\phi$ which contains information in the form of the phase shift in the carrier. However channel conditions may arise which can result in a phase shift in the transmitted signal $\phi$. The received signal $\phi$ again may be expressed by equations (10).

Modem 30 converts the received signal $\phi$ to quantized I and Q components according to equation (11). The I and Q components are provided to decoder 32 where converted to a an initial four-bit sector value (W, X, Y, Z). The sector value (W, X, Y, Z) is again related to the phase of the received signal in accordance with Table IV.

Modem 30 provides an output of the I and Q components to decoder 32 for decoding and error correction. Decoder 32 is constructed as was discussed with reference to the case for 8-PSK modulation with differences in the values for lookup tables 34, 36 and 38. Similarly delay 48 and, sector rotation logic are configured for a operating on a four-bit sector value. Furthermore output mapper 52 is configured to provide the symbols (w, x) to differential decoder 44 which is configured as an octal differential decoder.

The I and Q components are provided to arctangent lookup table 34 which provides an output of phase value $\hat{\theta}$ and amplitude value R to branch metric lookup table 36 and sector value lookup table 38. The corresponding branch metric is output from lookup table 36 to Viterbi decoder 40 while the sector value is output from lookup table 38 to delay circuit 48.

Decoder 40 as previously mentioned provides an output of normalization data which is used by normalization rate detection circuitry 42 to detect a high normalization rate indicative of channel phase shifts of 22.5°, 67.5°, 112.5°, 157.5°, 202.5°, 247.5°, 292.5°, or 337.5°. Upon detection of a high normalization rate, normalization rate detection circuitry 42 provides a phase shift signal to the input processor section of Viterbi decoder 40 and to sector rotation logic 50. Viterbi decoder 40 is responsive to the phase shift signal so as to provide a shift in the branch metrics corresponding to a shift in the signal space of $\pi/8$, i.e., branch metrics corresponding to a 22.5° degree shift in the signal space. along with a corresponding shift in the sector value bits ($\hat{w}$, $\hat{x}$, $\hat{y}$, $\hat{z}$).

The phase shift signal as provided to sector rotation logic results in a shift in the sector value corresponding to one of a phase shift of one of 0°, 45°, 90°, 135°, 180°, 225°, 270° and 315°. At each one of these phase shifts the Viterbi decoder is capable of recovering data.

Viterbi decoder 40 provides as an output to convolutional encoder 46 a best estimate $\hat{j}'$ of the transmitted data symbol j'. Convolutional encoder 46 re-encodes the symbol j' according to the same polynomial functions G1(D) and G0(D) as that of encoder 18 of FIG. 1, e.g., the respective polynomials 171 and 133. Convolutional encoder 46 thus produces the symbols ($\hat{y}$, $\hat{z}$) which are corrected estimates of the transmitted phase point bits (y, z). The symbols ($\hat{y}$, $\hat{z}$) are output from convolutional encoder 46 to trellis output mapper 52. The symbol $\hat{y}$ is also provided to octal differential decoder 54.

The sector value (W, X, Y, Z) is provided from lookup table 38 through delay circuit 48 to sector rotation logic 50 from lookup table 38 where rotated by a sector value of $\pi/8$ in response to the phase shift signal. In the absence of the phase shift signal the sector value input to sector rotation logic 50 is output therefrom.

The output sector value from sector rotation logic 50 is provided to trellis output mapper 52 along with the re-encoded symbols ($\hat{y}$, $\hat{z}$) from convolutional encoder 46. Trellis output mapper 52 provides in response to the unrotated or rotated sector value symbols (W, X, Y, Z) and the reencoded symbols ($\hat{y}$, $\hat{z}$), the output symbols ($\hat{w}$, $\hat{x}$) which corresponds to a corrected estimate of the most significant bits of the originally transmitted phase point, the uncoded symbols (w, x). The symbols ($\hat{w}$, $\hat{x}$) are determined in trellis output mapper 52 in accordance with Table VI.

The output symbols ($\hat{w}$, $\hat{x}$) from trellis output mapper 52 are provided to differential decoder 44 along with the re-encoded bit $\hat{y}$ (which is the bit $\hat{j}$) from convolutional encoder 46. Using the best estimates of symbols ($\hat{w}$, $\hat{x}$, $\hat{j}$), differential decoder 44 performs an eight-phase differential decoding operation. The resultant output from differential decoder 44 are the estimates of the transmitted data bits ($\eta$, $\epsilon$, $\rho$) with these estimates respectively denoted by the reference characters ($\hat{\eta}$, $\hat{\epsilon}$, $\hat{\rho}$).

TABLE VI

| SEC-TOR NO. | SECTOR VALUE (W, X, Y, Z) | ($\hat{y}$, $\hat{z}$) | | | |
|---|---|---|---|---|---|
| | | (0,0) ($\hat{w}$, $\hat{x}$) = | (0,1) ($\hat{w}$, $\hat{x}$) = | (1,1) ($\hat{w}$, $\hat{x}$) = | (1,0) ($\hat{w}$, $\hat{x}$) = |
| 0  | 0000 | 00 | 00 | 00 | 10 |
| 1  | 0001 | 00 | 00 | 00 | 00 |
| 2  | 0010 | 01 | 00 | 00 | 00 |
| 3  | 0011 | 01 | 01 | 00 | 00 |
| 4  | 0100 | 01 | 01 | 01 | 00 |
| 5  | 0101 | 01 | 01 | 01 | 01 |
| 6  | 0110 | 11 | 01 | 01 | 01 |
| 7  | 0111 | 11 | 11 | 01 | 01 |
| 8  | 1000 | 11 | 11 | 11 | 01 |
| 9  | 1001 | 11 | 11 | 11 | 11 |
| 10 | 1010 | 10 | 11 | 11 | 11 |
| 11 | 1011 | 10 | 10 | 11 | 11 |
| 12 | 1100 | 10 | 10 | 10 | 11 |
| 13 | 1101 | 10 | 10 | 10 | 10 |
| 14 | 1110 | 00 | 10 | 10 | 10 |
| 15 | 1111 | 00 | 00 | 10 | 10 |

The present invention can be easily extended to resolving phase ambiguities that may occur in the transmission of any M-PSK modulated trellis coded data. Referring back to FIG. 1, encoder 10 and modem 12 are configured for M-PSK modulation as previously mentioned. In this general case, L is the number of bits necessary to describe uniquely the set $\{0,1,2\ldots,M-1\}$ where L=$\log_2$M. In a general implementation encoder 10 receives a L−1 bit set of input data (D(1), D(2), ... , D(L−1)) and generates a L bit phase point value (O(1), O(2), ..., O(L)). The phase point value is output from encoder 10 to a M-PSK mapper or modem 12 where the phase of the carrier signal is shifted in accordance with the L bit phase point value.

A set of L−1 data bits is input to encoder 10 where they are provided as input to an M/2 phase differential encoder 14. Differential encoder 14 differentially encodes each L−1 bit set (D(1), D(2), ..., D(L−1)) to provide a corresponding resultant L−1 bit set (o(1), o(2), ..., o(L−2), k). Techniques for differential encoding of the bits along with the circuit designs for this type of differential encoder are well known in the art. One of the differentially encoded symbols, k, is provided to precoder 16, the remaining symbols (o(1), o(2), ..., o(L−2)) are provided to modem 12 as the most significant symbols of the L bit phase point value.

Precoder 16 encodes the symbol, k, according to a transfer function $1/G_1(D)$ to provide a precoded symbol, k'. The precoded symbol, k', is output from precoder 16 to encoder 18. Convolutional encoder 18 again in an exemplary embodiment is a rate ½, K=7 convolutional encoder which convolutionally encodes each precoded symbol according to the transfer function $G_1(D)$ and $G_0(D)$ so as to provide two convolutionally encoded symbols, the symbols o(L−1) and o(L). The two convolutionally encoded symbols output from encoder 10, symbols o(L−1) and o(L), are provided as inputs to modem 12 as the next-to-least and least significant bits of the L bit phase point value.

Encoder 10 of FIG. 1 in using precoder 16 and convolutional encoder 18 having an inverse transfer relationship for one of the encoded symbols permits decoding of the transmitted data so as to overcome phase ambiguities caused by the transmission channel. Phase ambiguities of the form:

$$\frac{360(2i + 1)}{M}, \text{ where } i = 0, 1, 2, \ldots, M/2 - 1 \quad (12)$$

are resolved at the decoder by monitoring the Viterbi decoder state metric growth rate and providing a branch metric shift along with a shift in the sector value. The use of precoder 16 in the encoding process facilitates the resolution of phase ambiguities of the form:

$$\frac{360(2i)}{M}, \text{ where } i = 0, 1, 2, \ldots, M/2 - 1 \quad (13)$$

at the decoder.

The signal space is divided up into M sectors identified by corresponding sector numbers 0 to M−1. Associated with each sector is a L bit phase point (transmission). One example of the numerology for assigning phase point values is by a modified gray code similar to described in the 8-ary and 16-ary examples. In the modified gray code the coded symbols which represent the least significant bits of phase point information are coded in gray code fashion, and the remaining most significant bits identify the major fraction of the phase plane. For example, in the 8-ary case the most significant bit identifies the half plane, in the 16-ary case the quarter plane, by extension in a 32-ary case the eighth plane and so on.

Referring back to FIG. 5, modem 30 and TCM decoder 32 of the present invention are also readily configured for demodulation of a M-PSK modulated signal where no phase reference is provided. Modem 30 again receives the phase shifted carrier signal $\hat{\phi}$ which contains information in the form of the phase shift in the carrier. However channel conditions may arise which can result in a phase shift in the transmitted signal $\phi$. The received signal $\hat{\phi}$ again may be expressed by equations (10).

Modem 30 converts the received signal $\hat{\phi}$ to quantized I and Q components according to equation (11). The I and Q components are provided to decoder 32 where converted to a an initial L-bit sector value.

Modem 30 provides an output of the I and Q components to decoder 32 for decoding and error correction. Decoder 32 is constructed as was discussed with reference to the cases for 8-PSK and 16-PSK modulation with differences in the values for lookup tables 34, 36 and 38. Similarly delay 48 and, sector rotation logic are configured for a operating on a log₂M-bit sector value. Furthermore output mapper 52 is configured to provide L−2 symbols to differential decoder 44 which is configured as an M/2 differential decoder.

The I and Q components are provided to arctangent lookup table 34 which provides an output of phase value θ and amplitude value R to branch metric lookup table 36 and sector value lookup table 38. The corresponding branch metric is output from lookup table 36 to Viterbi decoder 40 while the sector value is output from lookup table 38 to delay circuit 48.

Decoder 40 as previously mentioned provides an output of normalization data which is used by normalization rate detection circuitry 42 to detect a high normalization rate indicative of channel phase shifts of the form:

$$\frac{360(2i + 1)}{M}, \text{ where } i = 0, 1, 2, \ldots, M/2 - 1. \quad (14)$$

Upon detection of a high normalization rate, normalization rate detection circuitry 42 provides a phase shift signal to the input processor section of Viterbi decoder 40 and to sector rotation logic 50. Viterbi decoder 40 is responsive to the phase shift signal so as to provide a shift in the branch metrics corresponding to a shift in the signal space of $2\pi/M$.

The phase shift signal as provided to sector rotation logic results in a shift in the sector value corresponding to one of a phase shift of the form:

$$\frac{360(2i)}{M}, \text{ where } i = 0, 1, 2, \ldots, M/2 - 1. \quad (15)$$

At each one of these phase shifts the Viterbi decoder is capable of recovering data.

Viterbi decoder 40 provides as an output to convolutional encoder 46 a best estimate of the transmitted coded data symbol. Convolutional encoder 46 re-encodes the symbol $\hat{k}'$ according to the same polynomial functions $G_1(D)$ and $G_0(D)$ as that of encoder 18 of FIG. 1. Convolutional encoder 46 thus produces two symbols, o(L−2) and o(L−1) which are corrected estimates of the transmitted least significant phase point bits. The corrected estimates are output from convolutional encoder 46 to trellis output mapper 52. The symbol that is convolutionally encoded according to the transfer function $G_1(D)$, o(L−1), is also provided to M/2 differential decoder 54.

The uncorrected sector value estimate is provided from lookup table 38 through delay circuit 48 to sector rotation logic 50 from lookup table 38 where rotated by a sector value of $2\pi/M$ in response to the phase shift signal. In the absence of the phase shift signal the sector value input to sector rotation logic 50 is output therefrom.

The output sector value, from sector rotation logic 50 is provided to trellis output mapper 52 along with the re-encoded symbol from convolutional encoder 46. Trellis output mapper 52 provides in response to the unrotated or rotated sector value symbols and the re-encoded symbols, a corrected estimate of the most significant bits of the originally transmitted phase point (o(1), o(2) ..., o(L−2)).

The output symbols from trellis output mapper 52 are provided to differential decoder 44 along with the symbol that is convolutionally encoded according to the transfer function $G_1(D)$. Using the best estimates of the transmitted symbols, differential decoder 44 performs an M/2-phase differential decoding operation. The resultant output from differential decoder 44 (($\hat{D}(1)$, $\hat{D}(2)$, ... $\hat{D}(L-1)$)) are the estimates of the $L-1$ transmitted data bits ($D(1)$, $D(2)$, ..., $D(L-1)$).

Utilization of the just described encoder and decoder scheme enables trellis coded modulation to become a practical technique in data communication systems. The present invention therefore permits a viable resolution in the encoding and decoding of trellis coded data to overcome phase ambiguities experienced as a result of the transmission channel. The encoder and decoder may be formed in VLSI form on separate chips or on a single chip. Furthermore, the encoder for both the 8-PSK and 16-PSK modulation may be integrally formed using a sharing of common elements, and similarly so for the decoder. Although the exemplary embodiment of the present invention is disclosed in terms of a rate $\frac{1}{2}$, constraint length $K=7$ code, with 8-PSK and 16-PSK modulation, the teachings of the present invention may be expanded upon to include other code rates, constraint lengths and higher levels of M-ary modulation.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An apparatus for trellis coding of input data as phase point data for M-ary modulation and transmission upon a communication channel, comprising:
    input encoder means for receiving and encoding according to a first encoding format a set of input data bits to provide a set of symbols;
    precoder means for encoding according to a second encoding format a first symbol of said set symbols to provide a second symbol;
    output encoder means for encoding said second symbol according to a third encoding format to provide a third symbol wherein said second encoding format has an inverse transfer function relationship with said third encoding format, encoding said second symbol according to a fourth encoding format to provide a fourth symbol; and
    wherein remaining symbols of said set of symbols and said third and fourth symbols collectively represent phase point data.

2. The apparatus of claim 1 wherein said third and fourth symbols respectively represent next-to-least significant and least significant symbols of said phase point data.

3. The apparatus of claim 1 wherein said set of input data bits is comprised of a pair of data bits and said set symbols is comprised of a pair of symbols.

4. The apparatus of claim I wherein said set of input data bits is comprised of three data bits and said set symbols comprised of a three symbols.

5. The apparatus of claim 1 wherein said input encoder means is a differential encoder.

6. The apparatus of claim 5 wherein said precoder means has a transfer function of $1/G_1(D)$.

7. The apparatus of claim 6 wherein said output encoder means is a rate $\frac{1}{2}$ convolutional encoder having encoder transfer functions of $G_1(D)$ and $G_0(D)$.

8. The apparatus of claim 5 wherein said output encoder means is a rate $\frac{1}{2}$ convolutional encoder having encoder transfer functions of $G_1(D)$ and $G_0(D)$.

9. The apparatus of claim 1 wherein said precoder means has a transfer function of $1/G_1(D)$.

10. The apparatus of claim 1 wherein said output encoder means is a rate $\frac{1}{2}$ convolutional encoder having encoder transfer functions of $G_1(D)$ and $G_0(D)$.

11. A trellis encoder for generating phase data for M-ary PSK modulation comprising:
    a differential encoder having a plurality of inputs each for receiving a respective data bit of a set of input data bits, and a set of outputs;
    a precoder circuit having an input coupled to one output of said differential encoder and an output, said encoder circuit having a transfer function of $1/G_1(D)$; and
    a convolutional encoder having an input coupled to said precoder circuit output and a pair of outputs, said convolutional encoder having transfer functions of $G_1(D)$ and $G_0(D)$.

12. The trellis encoder of claim 11 wherein a respective data symbol is provided at each other output of said differential encoder and each output of said convolutional encoder where said data symbols collectively form phase data.

13. The trellis encoder of claim 11 wherein said convolutional encoder is of a rate $\frac{1}{2}$.

14. The trellis encoder of claim 13 wherein said differential encoder is a quadrature differential encoder having a pair of inputs and a pair of outputs.

15. The trellis encoder of claim 14 wherein a respective data symbol is provided at each other output of said differential encoder and each convolutional encoder output, where said data symbols collectively form phase data.

16. The trellis encoder of claim 13 wherein said differential encoder is an octal differential encoder having a trio of inputs and a trio of outputs.

17. The trellis encoder of claim 16 wherein a respective data symbol is provided at each other output of said differential encoder and each output of said convolutional encoder where said data symbols collectively form phase data.

18. The trellis encoder of claim 11 wherein said differential encoder is a quadrature differential encoder having a pair of inputs and a pair of outputs.

19. The trellis encoder of claim 11 wherein said differential encoder is an octal differential encoder having a trio of inputs and a trio of outputs.

20. A method for trellis coding of input data as phase point data for M-ary modulation and transmission upon a communication channel, comprising the steps of:
    encoding according to a first encoding format a set of input data bits to provide a set of symbols;
    encoding according to a second encoding format a predetermined symbol of said set of symbols to provide a second symbol;
    encoding said second symbol according to a third encoding format to provide a third symbol wherein said second encoding format has an inverse transfer function relationship with said third encoding format; and encoding said second symbol according to a fourth encoding format to provide a fourth symbol wherein remaining symbols of said set of symbols and said third and fourth encoded symbols collectively represent phase point data.

21. The method of claim 20 wherein said step of encoding according to a first encoding format a set of input data bits comprises the step of differentially encoding said set of input data bits.

22. The method of claim 20 wherein said step of encoding said second symbol comprises the step of convolutionally encoding said second symbol.

23. In a decoder for decoding received user data that is trellis coded as phase point data in an M-ary modulation scheme for transmission upon a communication channel which is susceptible to changes in channel conditions so as to induce phase ambiguities in said M-ary modulated signals and resulting in corresponding errors in said phase point data as received, an apparatus for resolving the effect of phase ambiguity errors in said phase point data during the decoding of said trellis coded user data wherein said user data is trellis coded by encoding a set of user data bits according to a first encoding format to produce a set of symbols, encoding a first symbol of said set of symbols according to a transfer function of $1/G_1(D)$ to produce a second symbol, encoding said second symbol according to transfer functions of $G_1(D)$ and $G_0(D)$ to produce third and fourth symbols wherein remaining symbols of said symbol set and said third and fourth symbols are transmitted as phase point data in an M-ary PSK modulated format, from which in the decoder phase point data is converted into estimates of said remaining symbols, and a Viterbi decoder generates from said phase point data an estimate of said second symbol, said apparatus comprising:

first encoder means for receiving said second symbol estimate and encoding said second symbol estimate according to a transfer function of $G_1(D)$ to produce an estimate of said first symbol; and first decoder means for receiving an estimate of said remaining symbols and said first symbol estimate and decoding according to a first decoding format to produce an estimate of said user data.

24. The apparatus of claim 23 wherein said first symbol comprises one symbol and said remaining symbols comprise one symbol and said user data estimates comprise two bits.

25. The apparatus of claim 23 wherein said first symbol comprises one symbol and said remaining symbols comprise two symbols, and said user data estimate comprises three bits.

26. The apparatus in claim 23 wherein said first encoder means is a rate $\frac{1}{2}$ convolutional encoder having encoder transfer functions of $G_1(D)$ and $G_0(D)$.

27. The apparatus of claim 26 wherein said first encoding format is quadrature differential encoding and said first decoder means is a quadrature differential decoder having a pair of inputs and a pair of outputs.

28. The apparatus of claim 26 wherein said first encoding format is octal differential encoding and said first decoder means is an octal differential decoder having three inputs and three outputs.

29. The apparatus of claim 23 wherein said first encoding format is quadrature differential encoding and said first decoder means is a quadrature differential decoder having a pair of inputs and a pair of outputs.

30. The apparatus of claim 23 wherein said first encoding format is octal differential encoding and said first decoder means is an octal differential decoder having three inputs and three outputs.

31. In a decoder for decoding trellis coded user data, said user data trellis encoded by differentially encoding a set of user data bits to produce a set of symbols, encoding a first symbol of said set of symbols according to a transfer function of $1/G_1(D)$ to produce a second symbol, encoding said second encoded symbol according to respective transfer functions of $G_1(D)$ and $G_0(D)$ to produce third and fourth symbols wherein said remaining symbols of said symbol set and said third and fourth symbols are transmitted as phase point data in an M-ary PSK modulated format, on which in the decoder phase point data is converted into estimates of said remaining symbols, and a Viterbi decoder generates from said phase point data an estimate of said second symbol; a decoder for resolving phase ambiguity errors in said phase point data comprising;

a convolutional encoder having an input for receiving said second symbol estimate, encoding said second symbol estimate according to a transfer function of $G_1(D)$ to produce an estimate of said first symbol of said symbol set; and a differential decoder having a set of first inputs for receiving an estimate of said remaining symbols of said symbol set and said first symbol estimate of said symbol set and decoding according to a first decoding format to produce estimates of said user data bits.

32. The decoder of claim 31 wherein said convolutional encoder is of a rate $\frac{1}{2}$.

33. The decoder of claim 32 wherein said user data is differentially encoded by a quadrature differential encoder and said differential decoder is a quadrature differential decoder having a pair of inputs and a pair of outputs.

34. The decoder of claim 32 wherein said user data is differentially encoded by a octal differential encoder and said differential decoder is an octal differential decoder having three inputs and three outputs.

35. The decoder of claim 31 wherein said user data is differentially encoded by a quadrature differential encoder and said differential decoder is a quadrature differential decoder having a pair of inputs and a pair of outputs.

36. The decoder of claim 31 wherein said user data is differentially encoded by a octal differential encoder and said differential decoder is an octal differential decoder having three inputs and three outputs.

37. A method for decoding received user data that is trellis coded as phase point data in an M-ary modulation scheme for transmission upon a communication channel which is susceptible to changes in channel conditions so as to induce phase ambiguities in said M-ary modulated signals and resulting in corresponding errors in said phase point data as received, an apparatus for resolving the effect of phase ambiguity errors in said phase point data during the decoding of said trellis coded user data wherein said user data is trellis coded by encoding a set of user data bits according to a first encoding format to produce a set of symbols, encoding a first symbol of said set of symbols according to a transfer function of $1/G_1(D)$ to produce a second symbol, encoding said second symbol according to transfer functions of $G_1(D)$ and $G_0(D)$ to produce third and fourth symbols wherein remaining symbols of said symbol set and said third and fourth symbols are transmitted as phase point data in an M-ary PSK modulated format, from which in the decoder phase point data is converted into estimates of said remaining symbols, and a Viterbi decoder generates from said phase point data an estimate of said second symbol, said method comprising the steps of:

encoding according to a first encoding format an estimate of said second symbol to provide an estimate of said first symbol;

decoding according to a first decoding format estimate of each of said remaining symbols and said first symbol estimate to produce estimates of said user data bits.

38. The method of claim 37 wherein said step of encoding according to said first encoding format comprises the step of convolutionally encoding said second symbol estimate according to a transfer function $G_1(D)$.

39. The method of claim 37 wherein said step of decoding according to said first decoding format comprises differentially decoding said remaining symbol estimates and said first symbol estimate.

40. A decoder comprising;

converter means for converting and receiving a phase shifted data signal representative of user data encoded as trellis coded symbol data, into an estimate of said trellis coded symbol data, and for generating a corrected estimate of a first transfer function encoded symbol;

encoder means for encoding said first transfer function encoded symbol corrected estimate according to a set of transfer functions to provide a set of reencoded trellis coded symbol estimates, wherein one transfer function of said set of transfer functions is an inverse of said first transfer function, and wherein said estimate of said reencoded trellis coded symbol estimates encoded according to said inverse of said first transfer function is provided as a first corrected symbol;

sector logic means for responsive to said trellis coded symbol data estimate and said set of reencoded trellis coded symbol estimates for providing a remaining set of corrected symbols; and differential decoder means for differentially decoding said first corrected symbol and said remaining corrected symbol set to produce estimates of user data.

41. The apparatus of claim 40 wherein said estimate of said trellis coded symbol data is comprised of three symbols, said corrected estimate of a precoded symbol is comprised of one symbol and said estimate of user data bit is comprised of two bits.

42. The apparatus of claim 40 wherein said estimate of said trellis coded symbol data is comprised of four symbols, said corrected estimate of a precoded symbol is comprised of one symbol and said estimate of user data bit is comprised of three bits.

43. The apparatus of claim 40 wherein said converter means is comprised of:

an arc tangent lookup table memory having an input for receiving said phase shifted data signal and an output;

a branch metrics lookup table memory having an input connected to said arc tangent lookup table memory output and an output;

a sector value lookup table memory having one input connected to said arc tangent lookup table memory output and an output connected to said sector logic means; and a Viterbi decoder having and input connected to said branch metrics lookup table memory output and an output connected to said encoder means and said differential decoder means.

44. The apparatus of claim 43 wherein said encoder means is a rate $\frac{1}{2}$ convolutional encoder having transfer functions of $G_1(D)$ and $G_0(D)$ with an input coupled to said Viterbi decoder output and a pair of outputs coupled to said sector logic means.

45. The apparatus of claim 44 wherein said sector logic means comprises:

normalization and rate detection circuitry having an input connected to said Viterbi decoder output and an output;

sector rotation logic having an input connected to said normalization and rate detection circuitry output and an output; and a trellis output mapper having an input connected to said sector rotation logic output.

46. The apparatus of claim 44 wherein said differential decoder means is a quadrature differential decoder having a pair of inputs respectively coupled to said convolutional encoder output and sector logic means and a pair of outputs.

47. The apparatus of claim 44 wherein said differential decoder means is a octal differential decoder having a pair of inputs connected to sector logic means and another input connected to said convolutional encoder means and three outputs.

48. The apparatus of claim 43 wherein said arc tangent lookup table memory converts said received phase shifted signal data into a corresponding phase angle estimate.

49. The apparatus of claim 48 wherein said branch metrics lookup table memory converts said phase angle estimate into a corresponding branch metric data.

50. The apparatus of claim 49 wherein said branch metrics lookup table memory is incorporated into said Viterbi decoder.

51. The apparatus of claim 48 wherein said sector value lookup table memory converts said phase angle estimate into said estimate of trellis coded symbol data.

52. The apparatus of claim 48 wherein said Viterbi decoder converts said branch metric data into said first corrected symbol.

53. The apparatus of claim 40 wherein said differential decoder means is a quadrature differential decoder having a pair of inputs respectively coupled to encoder means and sector logic means and a pair of outputs.

54. The apparatus of claim 40 wherein said differential decoder means is a octal differential decoder having a pair of inputs connected to sector logic means and another input connected to said encoder means and three outputs.

* * * * *